(12) United States Patent  (10) Patent No.: US 7,432,140 B2
Ting et al.  (45) Date of Patent: Oct. 7, 2008

(54) THIN FILM TRANSISTOR, THIN FILM TRANSISTOR SUBSTRATE, AND METHODS FOR MANUFACTURING THE SAME

(75) Inventors: Chin-Lung Ting, Tainan County (TW); Cheng-Chi Wang, Tainan County (TW)

(73) Assignee: Chi Mei Optoelectronics Corp., Tainan County (TW)

( * ) Notice: Subject to any disclaimer, the term of this patent is extended or adjusted under 35 U.S.C. 154(b) by 5 days.

(21) Appl. No.: 11/623,214

(22) Filed: Jan. 15, 2007

(65) Prior Publication Data

US 2007/0114535 A1  May 24, 2007

Related U.S. Application Data

(62) Division of application No. 11/085,420, filed on Mar. 21, 2005, now Pat. No. 7,199,399.

(30) Foreign Application Priority Data

Mar. 26, 2004  (TW) ............................... 93108422 A

(51) Int. Cl.
*H01L 21/00* (2006.01)

(52) U.S. Cl. ................ 438/164; 438/488; 257/E21.413

(58) Field of Classification Search ................ 438/164, 438/488; 257/E21.413
See application file for complete search history.

(56) References Cited

U.S. PATENT DOCUMENTS

| 6,274,888 | B1 | 8/2001 | Suzuki et al. |
| 6,436,745 | B1 * | 8/2002 | Gotou et al. ................ 438/166 |
| 6,703,289 | B2 * | 3/2004 | Muramatsu et al. ......... 438/486 |

* cited by examiner

*Primary Examiner*—Lex Malsawma
(74) *Attorney, Agent, or Firm*—Thomas, Kayden, Horstemeyer & Risley

(57) ABSTRACT

A thin film transistor includes a channel layer of a specific shape, a thermal gradient inducer body, a gate insulating film, a gate electrode and an interlayer insulating film, a source electrode and a drain electrode. The channel layer is formed on a substrate. The channel layer has a nucleation region and a crystal end. The thermal gradient inducer body partially circumscribes the channel layer. The gate insulating film is formed on the substrate, and the channel layer is at least partially covered with the gate insulating film. The gate electrode is formed on the gate insulating film. The interlayer insulating film is formed on the gate insulating film, and the gate electrode is at least partially covered with the interlayer insulating film. The source electrode and the drain electrode are formed on the interlayer insulating film, passed through the gate insulating film and the interlayer insulating film, and electrically connected to the channel layer.

4 Claims, 9 Drawing Sheets

THIN FILM TRANSISTOR, THIN FILM TRANSISTOR SUBSTRATE, AND METHODS FOR MANUFACTURING THE SAME

CROSS REFERENCE TO RELATED APPLICATION

This application is a Divisional of U.S. patent application Ser. No. 11/085,420, filed Mar. 21, 2005, now U.S. Pat. No. 7,199,399, and entitled "Thin Film Transistor, Thin Film Transistor Substrate, and Methods for Manufacturing the Same", which claimed the priority benefit of Taiwan Patent Application Serial Number 093108422, filed Mar. 26, 2004, the full disclosure of which is incorporated herein by reference.

TECHNICAL FIELD

The present disclosure generally relates to a thin film transistor, and more particularly to a thin film transistor including a channel layer of a specific shape and a thermal gradient inducer.

BACKGROUND

Low power consumption liquid crystal display devices utilize thin film transistors (hereinafter referred to as TFTs) as their driving elements because of their high performance characteristics such as high contrast and high response speed. Low power consumption liquid crystal display devices are frequently used in, among other things, personal computers (PCs), portable televisions (TVs) and the like, and thus, the market for TFTs has expanded markedly.

Most TFTs utilize amorphous silicon (hereinafter referred to as a-Si) or poly-silicon (hereinafter referred to as p-Si) as a semiconductor for a channel layer. The a-Si is a pure silicon material constituted by a plurality of silicon crystal grains without specific crystalline direction. However, the p-Si is a pure silicon material constituted by a plurality of small single crystal silicon grains with different crystalline direction, i.e., the p-Si is a pure silicon between the single crystal silicon and the a-Si. Electron mobility is greater in p-Si than in a-Si.

The deposition of the a-Si and p-Si layers includes nucleation, growth of crystal grain, gather of crystal grain, and growth of deposition film. Specifically, the deposition process of the silicon layer includes the following steps: attracting atoms diffusing the attracted atoms on a surface of the film; and gathering the attracted atoms at the proper step or neck location, thereby gradually forming a thin film and then growing the thin film. The driving power of the crystal grain growth, the crystal grain gather and the deposition film growth depends on the surface free energy, which gradually decreases with crystalline grain growth. The diffusion of attracted atoms on the surface of the silicon layer is related to the surface temperature. Higher surface diffusion occurs with higher the surface temperature, and consequently, it is easier to gather attracted atoms to an ideal location for growing large crystalline grains at higher surface temperatures than lower surface temperatures. Accordingly, there is a positive correlation between the size of crystal grain and the surface temperature. Furthermore, electron mobility increases with increased crystalline grain size.

U.S. Pat. No. 6,436,745, entitled "Method of Producing A Semiconductor Device", discloses a method of producing a semiconductor device and is incorporated herein by reference. The method includes the following steps of: crystallizing an amorphous silicon film or a partially crystalline amorphous silicon film using a catalytic metal element promoting crystallization of silicon to form a crystalline first silicon film; forming a second silicon film containing a group consisting V element directly on an entire surface of the first silicon film; subjecting the first silicon film and the second silicon film to a heat treatment to thereby gettering at least some of the catalytic metal element from the first silicon film to the second silicon film; and removing the second silicon film to which the catalytic metal element has been gettered. However, the semiconductor device utilizes the a-Si as a semiconductor for a channel layer, and thus has a lower mobility of electrons.

U.S. Pat. No. 6,436,745 utilized p-Si as a semiconductor for a channel layer. Referring to FIGS. 1a and 1b, a p-Si layer 10 is generally deposited on a substrate 12 by using a plasma chemical vapor deposition process and is patterned by using photolithography and etching processes, and then is crystallized to form a conventional channel layer 14 of p-Si by using a laser anneal process. However, generally the p-Si layer is kind of rectangular in shape. The entire surface temperature is uniformly decreased. Thus, thermal energy is not easily retained after the laser anneal process. Consequently, it is not easy for the p-Si crystal grain to be grown tomore than 100 micrometer.

In conventional channel layers such as the channel layer 14 of FIGS. 1a and 1b, nucleation can occur at several points in the channel layer 14. When there are many locations of nucleation, then there are many crystal grains, and consequently, the size of the crystal grains are small. When there are many crystal grains, then there are many grain boundaries, which decreases electron mobility.

Accordingly, there exists a need for a thin film transistor capable of having the big size of crystal grain and the higher mobility of electrons.

SUMMARY

Embodiments of the present disclosure include a thin film transistor and method for manufacturing a thin film transistor. Briefly described, in architecture, one embodiment of the thin film transistor, among others, can be implemented as follows. A substrate has a channel layer disposed thereon. The channel layer defines a nucleation region, which defines first transverse width, and a crystal end, which defines a second transverse width. The first transverse width is less than the second transverse width. A thermal gradient inducer body is disposed on the substrate. The thermal gradient inducer body substantially circumscribes the channel layer, and the thermal gradient inducer body and the channel layer define a gap.

Embodiments of the present disclosure can also be viewed as providing methods for manufacturing a thin film transistor. In this regard, one embodiment of such a method, among others, includes the steps of: providing a substrate; disposing an initial channel layer on the substrate; forming at least a portion of the initial channel layer into a shaped channel layer, the shaped channel layer defining a nucleation region having a first transverse width and a crystal region having a second transverse width; annealing at least the shaped channel layer; providing a thermal gradient inducer body proximal to the shaped channel layer; and inducing a thermal gradient in the shaped channel layer with the thermal gradient inducer body, wherein the thermal gradient inducer body causes the nucleation region of the shaped channel layer to dissipate heat faster than the crystal region.

Objects, methods, features, and advantages of the present disclosure will be or become apparent to one with skill in the art upon examination of the following drawings and detailed description. It is intended that all such additional objects, methods, features, and advantages be included within this description, be within the scope of the present disclosure, and be protected by the accompanying claims.

DETAILED DESCRIPTION

Figure 2A:
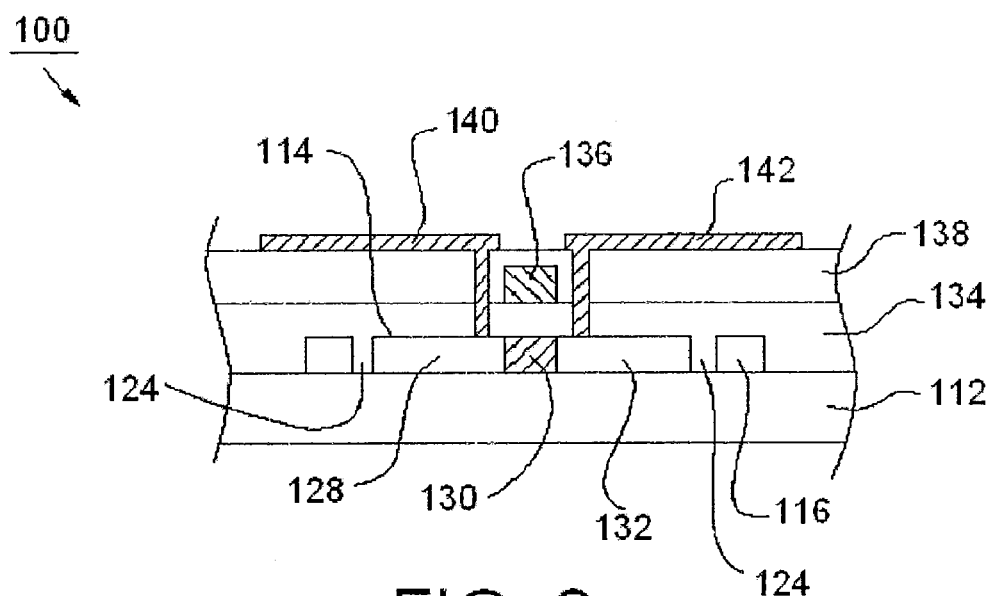
FIG. 2a is a cross-sectional schematic view of a thin film transistor according to an embodiment of the present disclosure.
Figure 2B:
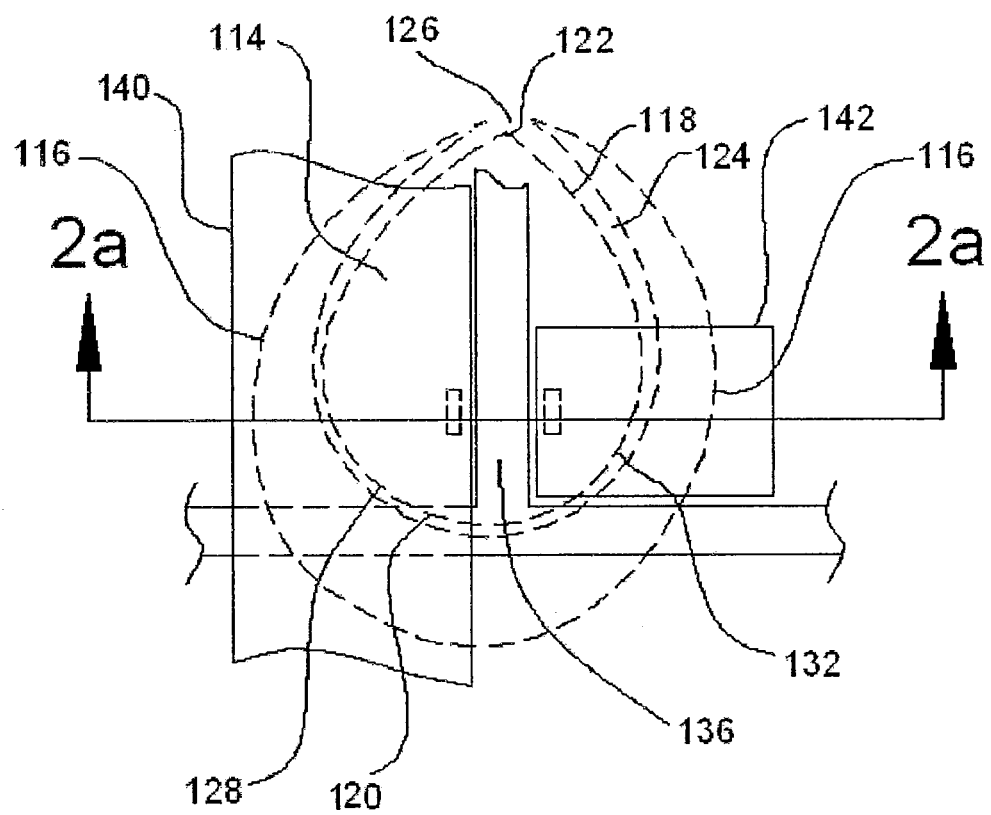
FIG. 2b is a plane schematic view of a thin film transistor according to an embodiment of the present disclosure.

Referring to FIGS. 2a and 2b, an embodiment of a thin film transistor 100 is illustrated. The thin film transistor (TFT) 100 is applied to a thin film transistor of a liquid crystal display device. The TFT 100 includes a channel layer 114 and a thermal gradient inducer body 116. The channel layer 114 has a specific shape, and the thermal gradient inducer body 116 has a shape that is generally complimentary to the specific shape of the channel layer 114. Typically, the complimentary shape of the thermal gradient inducer body 116 is such that the channel layer 114 is generally or substantially circumscribed by the thermal gradient inducer body 116. In one embodiment, the channel layer 114 and the thermal gradient inducer body 116 are formed on a substrate 112. In some embodiments, the thermal gradient inducer body 116 is comprised of a poly-silicon layer that generally circumscribes the channel layer 114.

Referring to FIG. 2b, the channel layer 114 is approximately tear-shaped having a nucleation region 118 and a crystal end region 120 that is distal from the nucleation region 118. The crystal end region 120 is broad in comparison to the nucleation region 118, and the nucleation region 118 includes a nucleation point 122. As will be described in detail hereinbelow, the channel layer is annealed, and recrystallization occurs at or near the nucleation point 122 of the nucleation region 118 and crystal grains grow toward the crystal end region 120. Non-limiting examples of shapes for the channel layer 114 include tear shape, triangular shape, shape of fan, shape of trapezoid, etc.

A variable thickness gap 124 extends between the channel layer 114 and the thermal gradient inducer body 116. The variable thickness gap 124 is approximately at its greatest gap size proximal to the nucleation point 122. Generally, the variable thickness gap 124, i.e., the distance between the channel layer 114 and thermal gradient inducer body 116, is such that the gap becomes smaller with greater distance from the nucleation point 122. In some embodiments, the thermal gradient inducer 116 defines an opening 126, which is approximately aligned with the nucleation point 122 such that the nucleation point 122 extends generally towards the opening 126.

The channel layer 114 includes a source region 128, an intermediate region 130 and a drain region 132. In addition, the TFT 100 includes a gate insulating film 134, a gate electrode 136, a first interlayer insulating film 138, a source electrode 140, and a drain electrode 142. The gate insulating film 134 is disposed on the substrate 112 and covers the channel layer 114 and the thermal gradient inducer body 116. The gate electrode 136 is disposed on the gate insulating film 134. The first interlayer insulating film 138 is disposed on the gate insulating film 134, and the gate electrode 136 is covered with the first interlayer insulating film 138. The source electrode 140 and the drain electrode 142 are disposed on the first interlayer insulating film 138, passed through the gate insulating film 134 and are electrically connected to the source region 128 and drain region 132, respectively. It is apparent to one of ordinary skill in the art that the present embodiments are not limited to a single thermal gradient inducer body 116 and a plurality of thermal gradient inducer bodies can also be implemented. An exemplary method for manufacturing a thin film transistor 100 is shown in FIGS. 3 to 9.

Figure 3:
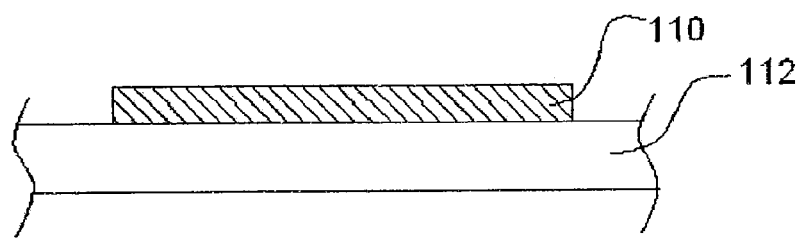
FIGS. 3 to 8 are cross-sectional and plane schematic views showing a method for manufacturing a thin film transistor according to an embodiment of the present disclosure.

Referring to FIG. 3, a initial channel layer 110 is deposited on the substrate 112 at a high reactive temperature, e.g. in the range of 575° C. to 650° C. by using a plasma chemical vapor deposition process. The plasma is utilized to decompose the gas molecule in the plasma chemical vapor deposition process to be atoms, ions or atom clusters.

Figure 4A:
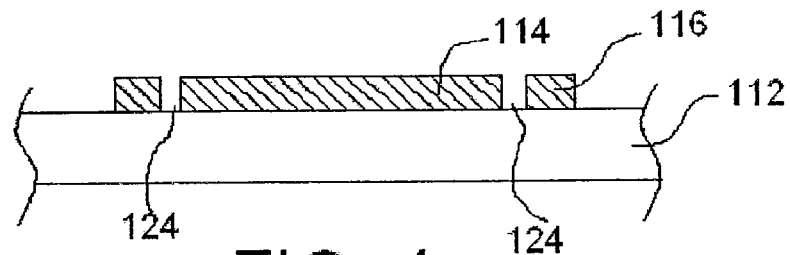
Figure 4B:
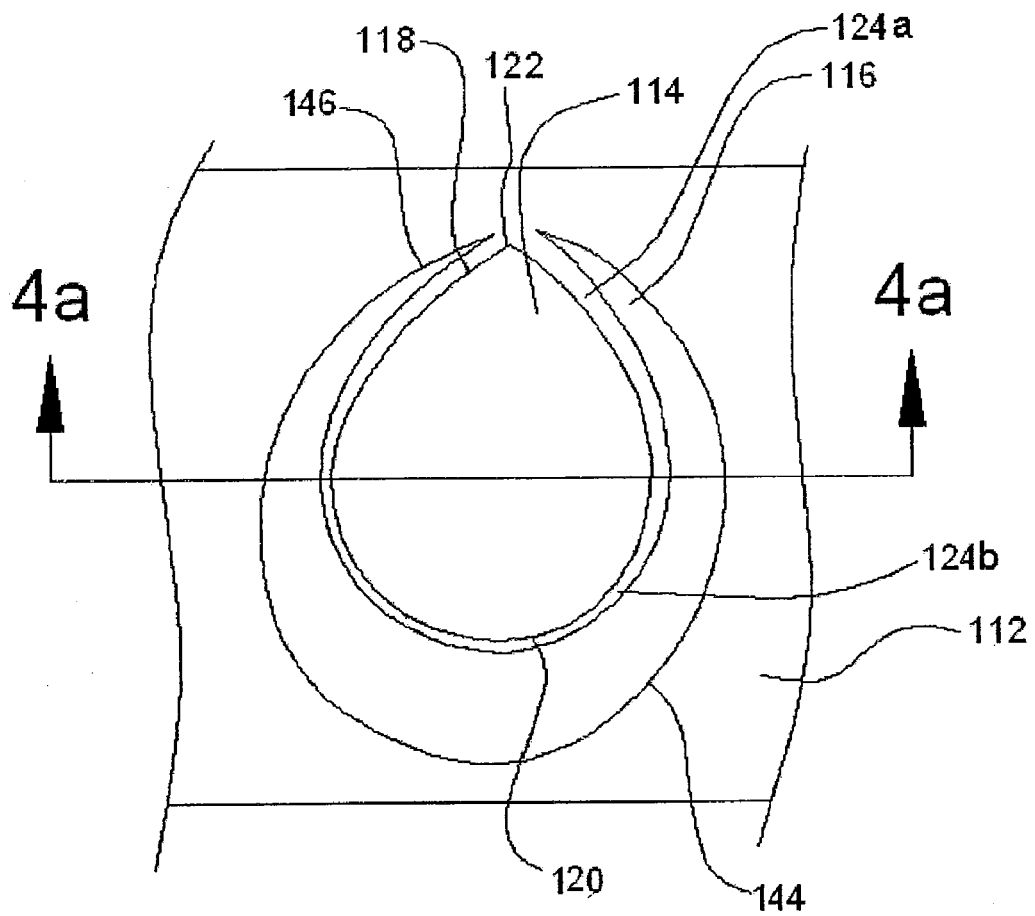
Figure 4C:
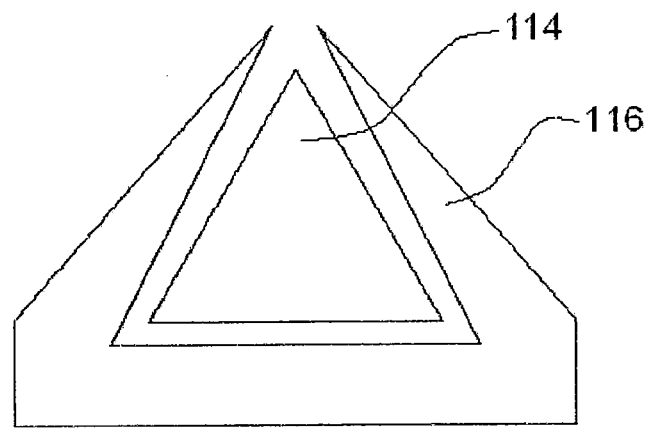
Figure 4D:
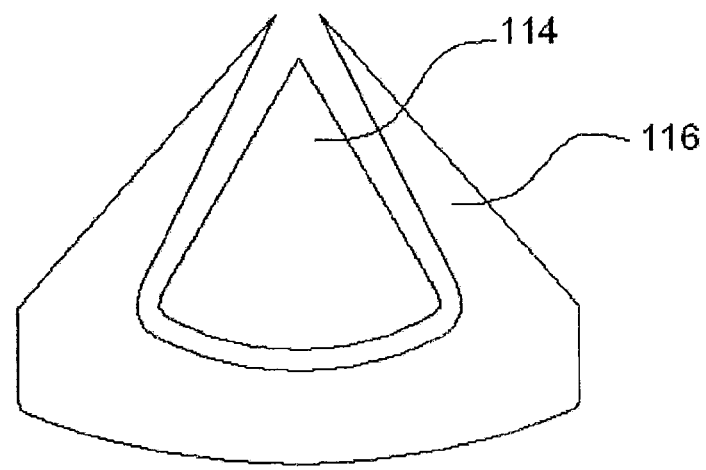
Figure 4E:
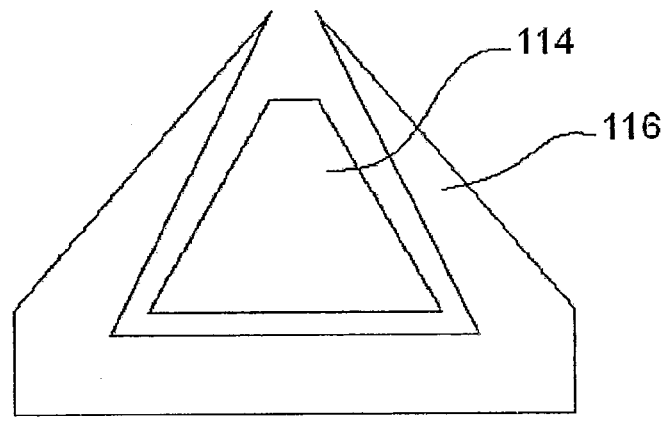

Referring to FIG. 4a, the initial channel layer 110 is patterned using photolithography and etching processes to form the channel layer 114 and thermal gradient inducer body 116 by forming the variable thickness gap 124 between the a channel layer 114 and the thermal gradient inducer body 116. The channel layer 114 defines the nucleation region 118 and the crystal end region 120, which is approximately distal from the nucleation point 122 of the nucleation region 118.

Among other shapes, the shape of the channel layer 114 can be tear shaped (shown in FIG. 4b), triangularly shaped (shown in FIG. 4c), fan shaped (shown in FIG. 4d), trapezoidal shaped(shown in FIG. 4e). etc. For the sake of clarity only the tear shaped embodiment is described in detail.

Referring to FIG. 4b again, the thermal gradient inducer body 116 generally circumscribes the channel layer 114. The thermal gradient inducer body 116 has a wide portion 144 and a narrow portion 146. The narrow portion 146 defines the opening 126. The narrow portion 146 is proximal to the nucleation region 118, and the wide portion 144 is proximal to the crystal end region 120.

Typically, portions of the initial channel layer 110 are removed such that the gap 124 extends down to the substrate layer 112 and such that the channel layer 114 is independent from and is not connected to the thermal gradient inducer body 116. The variable thickness gap 124 has a first gap thickness 124a between the wide portion 144 of the thermal gradient inducer body 116 and the crystal end region 120 of the channel layer 114 and a second gap thickness 124b between a narrow portion 146 of the thermal gradient inducer body 116 and the nucleation region 118 of the channel layer 114. The first gap thickness 124a is smaller than the second gap thickness 124b.

Figure 1A:
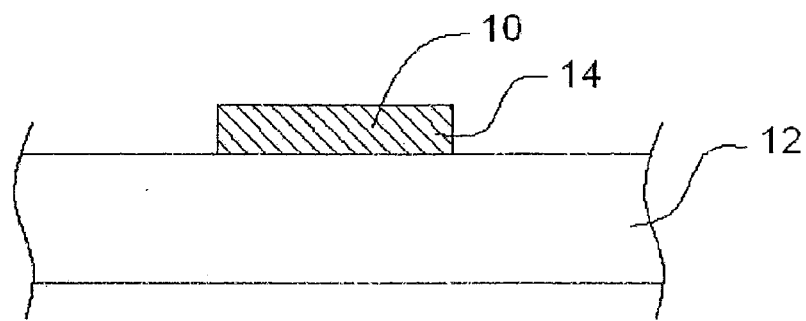
FIG. 1a is a cross-sectional schematic view of a poly-silicon layer of a thin film transistor in the prior art.
Figure 1B:
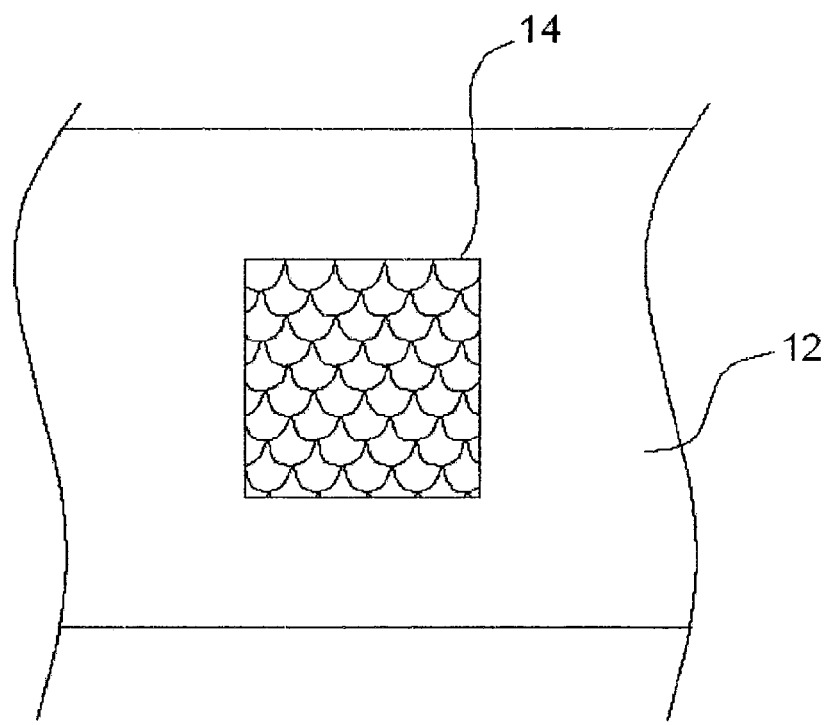
FIG. 1b is a plane schematic view of a poly-silicon layer of a thin film transistor in the prior art.

As those skilled in the art will recognize, the rate of heat dissipation in the crystal end region 120 is less than the rate of heat dissipation in the nucleation region 118 because, in part, of the differences in the gap thicknesses 124a and 124b and the shape of the thermal gradient inducer body 116. Heat absorbed by the wide portion 144 of the thermal gradient inducer body 116 is not dissipated as rapidly as heat absorbed by the narrow portion of the thermal gradient inducer body 116 because regions with more surface area per unit volume dissipate heat more rapidly than regions with lower surface area per unit volume. Thus, due to its shape, the wide portion 144 of the thermal gradient inducer body dissipates less heat than does the narrow portion 146 of the thermal gradient inducer body. Consequently, because the crystal end region 120 is broader than the nucleation region 118 and because the first gap thickness 124*a* is less than the second gap thickness 124*b*, the nucleation region 118 dissipates heat more rapidly than the crystal end region 120. As compared with the channel layer 14 shown in FIG. 1*b*, the channel layer 114 has a higher thermal gradient between the nucleation point 122 of the nucleation region 118 and the crystal end region 120 of the channel layer 114.

Generally, due to a thermal gradient across the channel layer 114, crystal grain growth starts at the nucleation point 122 of the nucleation region 118 and then diffuses towards the crystal end region end 120 of the channel layer 114. Crystal grains in the crystal end region 120 are frequently larger than crystal grains in a conventional channel layer such as channel 14 (see FIGS. 1*a* and 1*b*) because the crystal grain growth starts at one end of the channel layer 114, the nucleation point 122, and grows towards the other end, the crystal end region 120, and consequently, crystal grain growth is not hindered by the crystal grain bumping into another crystal grain growing from a different nucleation point. Thus, due in part to the larger crystal grains in the crystal region 120, which results in fewer grain boundaries in the crystal end region 120, electron mobility is higher in the channel layer 114 than in the conventional channel layer 14.

Figure 4F:
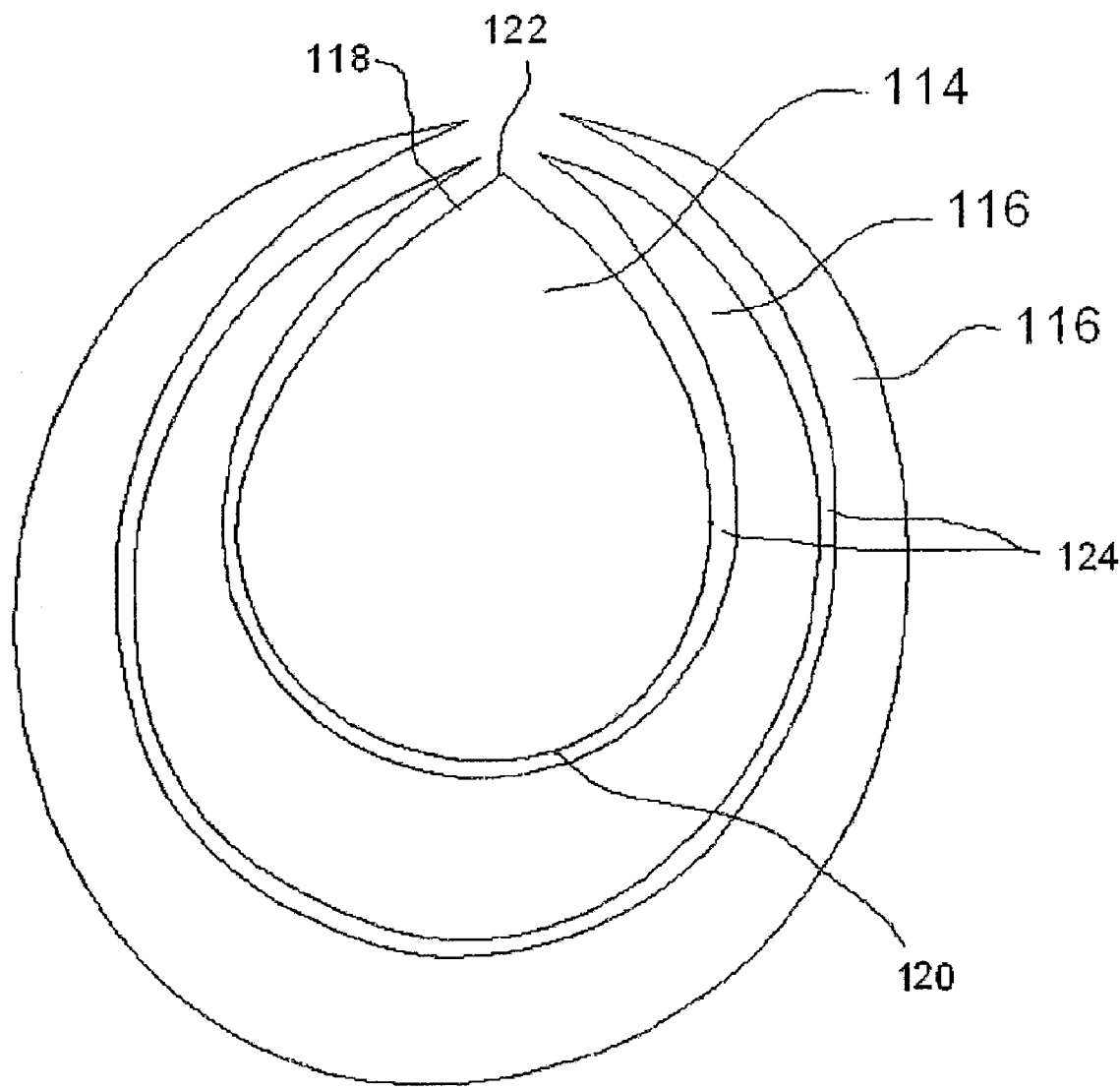

Referring to FIG. 4*f*, in an alternative embodiment, the channel layer 114 is substantially circumscribed by the thermal gradient inducer body 116, which in turn is substantially circumscribed by a second thermal gradient inducer body 116'. The second thermal gradient inducer body 116' increases the effective thermal heat reservoir of the thermal gradient inducer body 116 upon the crystal end region 120, which thereby increases the thermal gradient between the nucleation point 122 of the nucleation region 118 and the crystal end region 120 of the channel layer 114, which can thereby result in a poly-crystal grain, and even a single crystal in the channel layer 114.

Figure 5A:
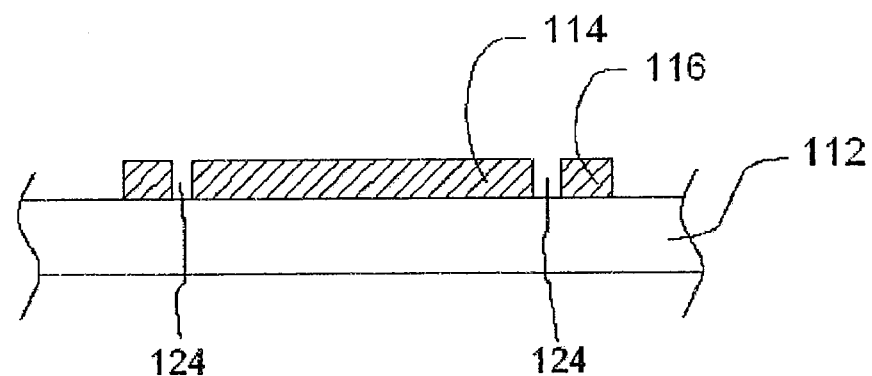
Figure 5B:
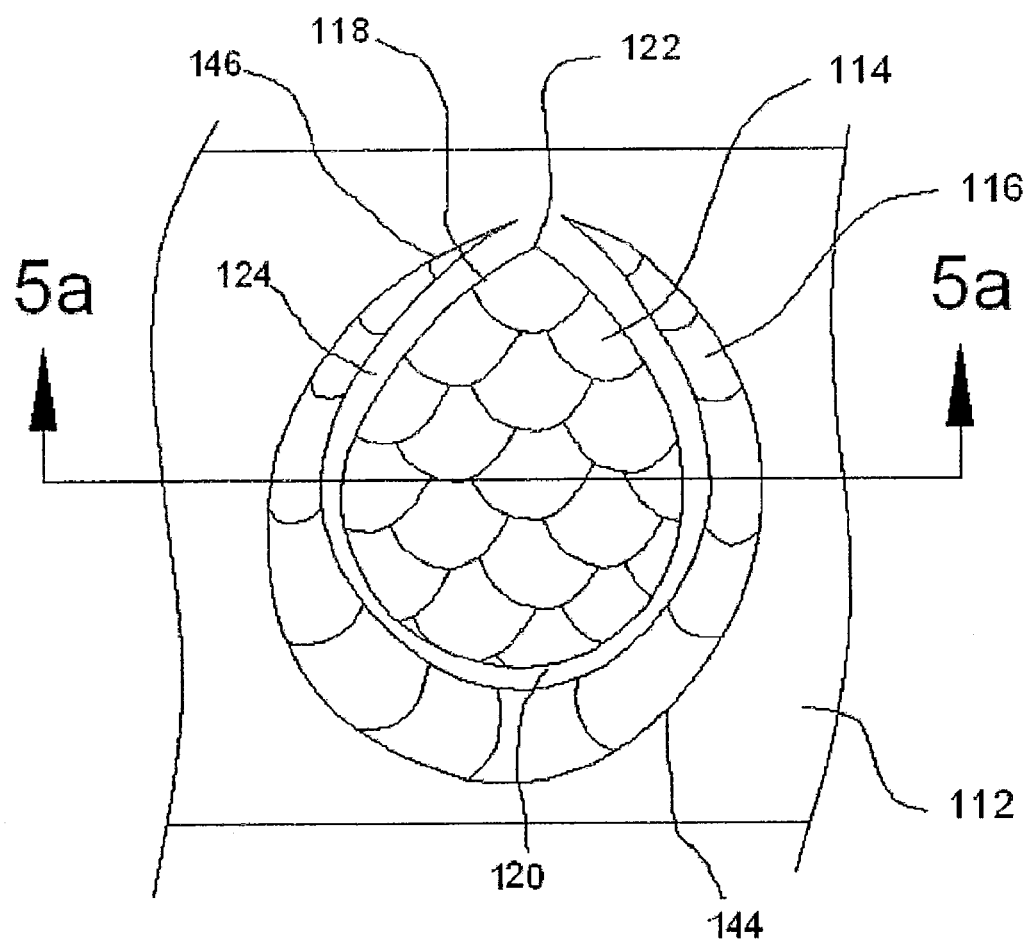

Referring to FIGS. 5*a* and 5*b*, the channel layer 114 and the thermal gradient inducer body 116 are annealed by using a laser anneal process. The energy of the laser anneal process increases atomic vibrations and diffusion of atoms and molecules and defects in the silicon layer to rearrange the atoms, and thus the channel layer 114 is processed to decrease the number of defects, which can result in the channel layer being a single crystal. Specifically, as is well known by those skilled in the art, heat dissipation is a function of both surface area and volume, and the surface area to volume ratio of the narrow portion 146 is larger than the surface area to volume ratio of the wide portion 144, and the rate of heat dissipation is greater at the narrow portion 146 than the wide portion 144. Consequently, after the thermal gradient inducer body 116 is annealed, a thermal gradient is produced across the thermal gradient inducer body 116 as the narrow portion 146 cools more rapidly than the wide portion 144.

Due in part to the thermal gradient in the thermal gradient inducer body 116, the shape of the channel layer 114, and the variable thickness gap 124, a thermal gradient is induced in the channel layer 114. Specifically, the temperature of the crystal region 120 of the channel layer 114 is higher than that of the nucleation region 118, and thus the direction of crystal grain growth in the channel layer 114 is from the nucleation point 122 of the nucleation region 118 to crystal region 120.

Figure 5C:
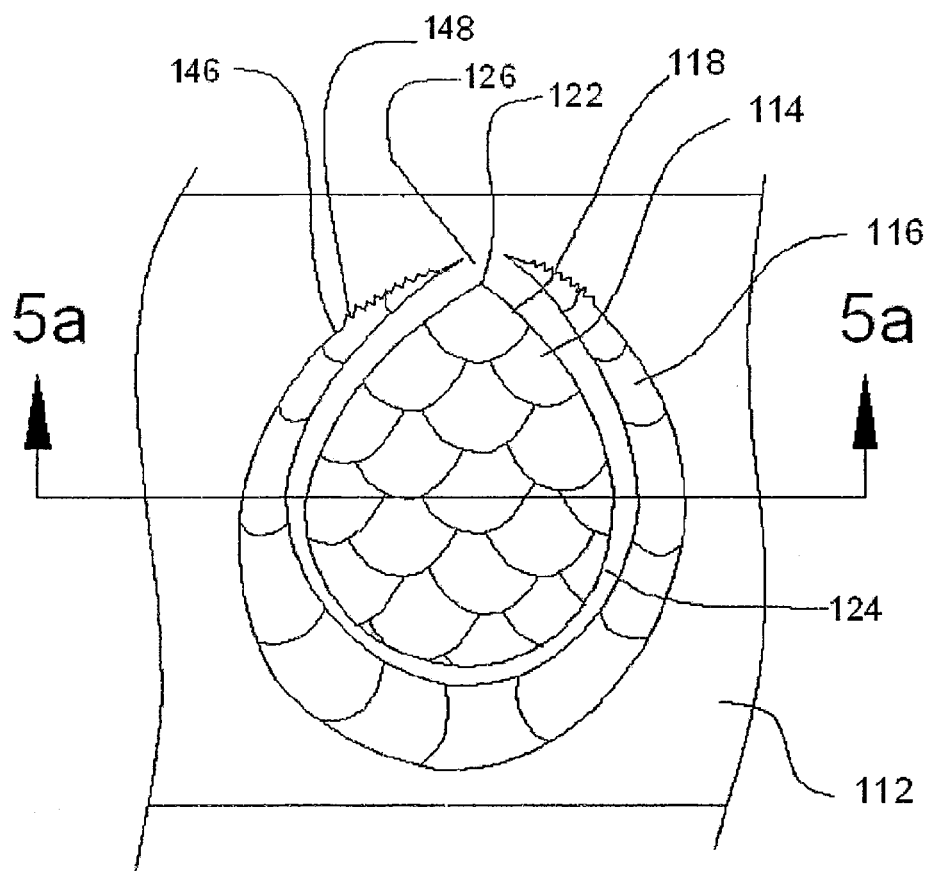

Referring to FIG. 5*c*, in one embodiment, the narrow portion 146 of the thermal gradient inducer body 116 includes saw-tooth shaped edges 148. The saw-tooth shaped edges 148 increase the surface area to volume ratio of the narrow portion 146, which thereby increases the rate of heat dissipation from the narrow portion 146 and, consequently, the thermal gradient across the thermal gradient inducer 116.

Figure 5D:
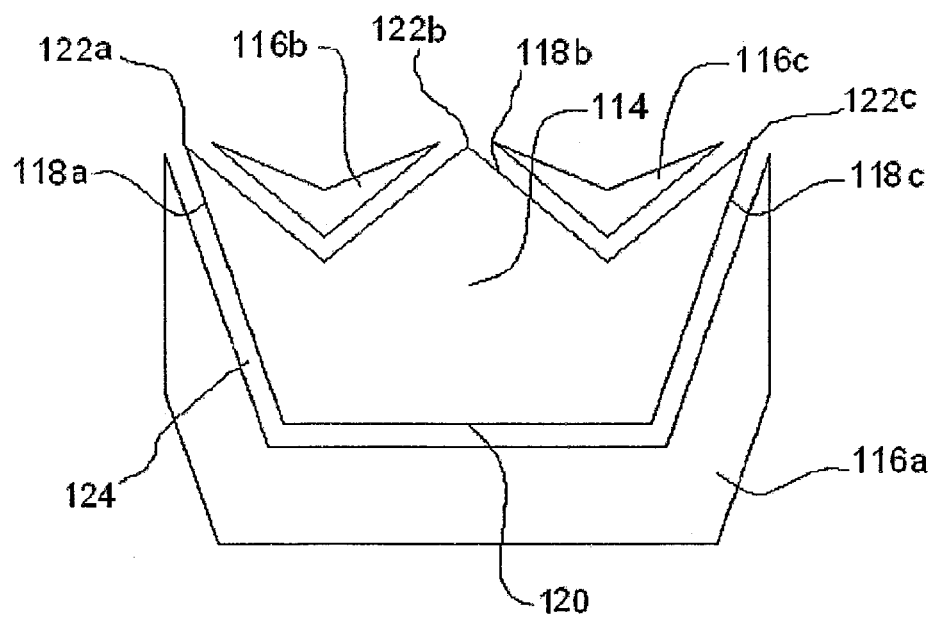

Referring to FIG. 5*d*, in one embodiment, the initial channel layer 110 is patterned to form an approximate crown shaped channel layer 114 and a plurality of thermal gradient inducer bodies 116*a*, 116*b*, and 116*c*. The crown shaped channel layer 114 includes a plurality of nucleation regions 118*a*, 118*b*, and 118*c*, each having a nucleation point 122*a*, 122*b*, and 122*c*, respectively. The thermal gradient inducer body 116*b* is complimentary to the shape of the crown shaped channel layer 114 and is located between the nucleation points 122*a* and 122*b*, and the thermal gradient inducer body 116*c* is complimentary to the shape of the crown shaped channel layer 114 and is located between the nucleation points 122*b* and 122*c*. As compared with the prior art reference, the method for manufacturing a thin film transistor of the present disclosure utilizes less energy of laser but manufactures the poly-silicon layers with bigger grain size.

Figure 6:
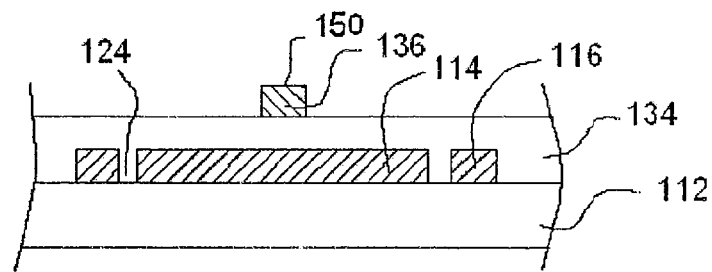

Referring to FIG. 6, the gate insulating film 134 is disposed over the substrate 112, the channel layer 114, and the thermal gradient inducer body 116. A first thin metal film 150 is formed on the gate insulating film 134, and patterned to form the gate electrode 136 by using photolithography and/or etching processes.

Figure 7:
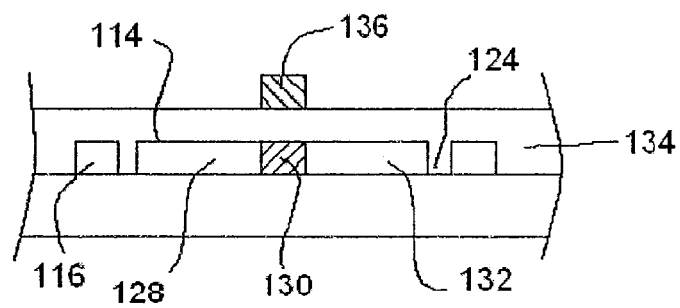

Referring to FIG. 7, the channel layer 114 is implanted with ion $P^-$ or ion $N^+$ to form the source region 128, the intermediate region 130 and the drain region 132 by using a ion-implanted process.

Figure 8:
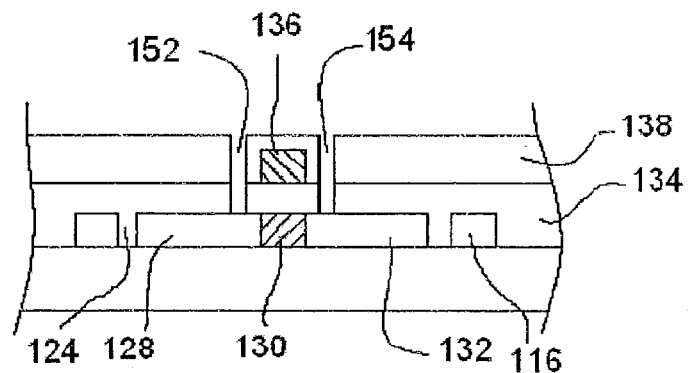

Referring to FIG. 8, the first interlayer insulating film 138 is disposed over the gate insulating film 134 and the gate electrode 136. Then, two contact holes 152, 154 are formed in the first interlayer insulating film 138 and the gate insulating film 134 by using photolithography and etching processes. The contact holes 152, 154 expose portion of the source region 128 and drain region 132.

Figure 9:
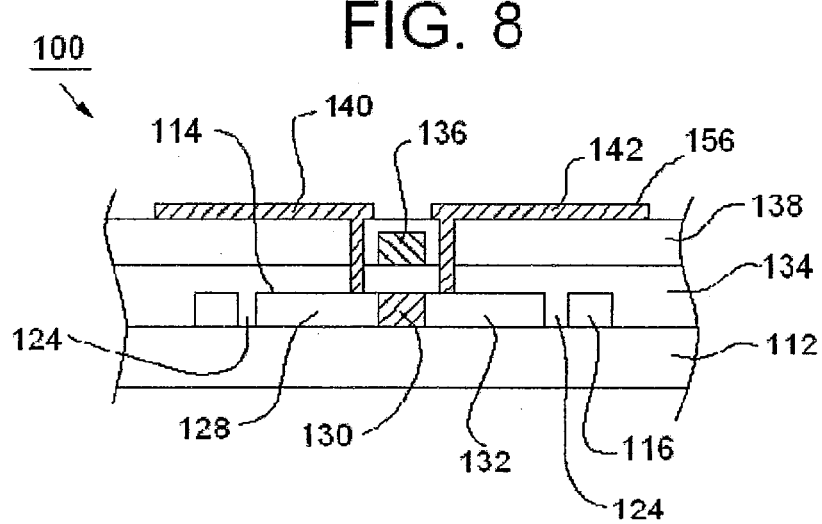
FIG. 9 is a cross-sectional schematic view of a thin film transistor substrate according to an embodiment of the present disclosure.

Referring to FIG. 9, a second thin metal film 156 disposed on the first interlayer insulating film 138 such that the two contact holes 152, 154 are generally filled with the second metal thin film 156. The second metal thin film 156 is patterned by using photolithography and etching processes such that the source electrode 140 and the drain electrode 142 are formed.

It should be noted that the channel layer 114 is in some embodiments a poly-silicon layer having large crystal grain size or a single crystal silicon, and thus, the channel layer 114 has the high electron mobility.

Figure 10:
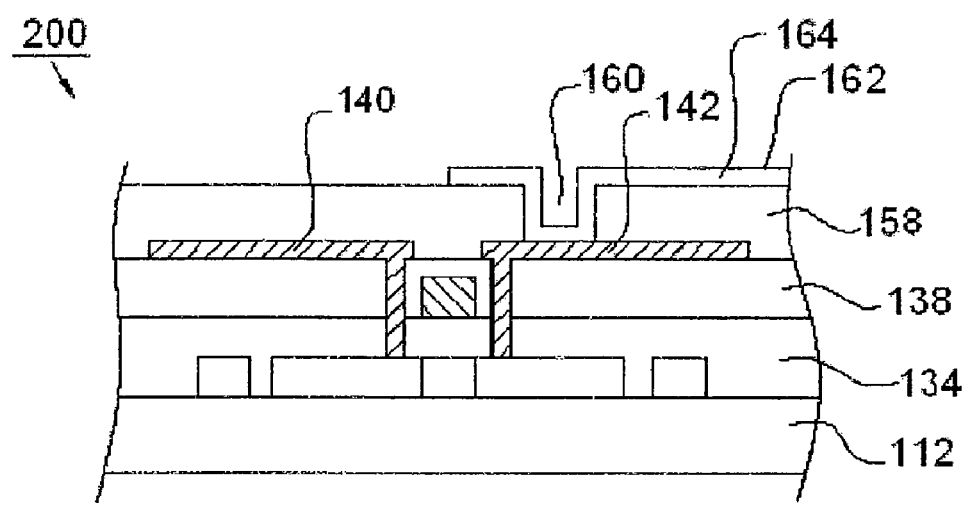
FIG. 10 is a cross-sectional schematic view of a thin film transistor substrate according to an embodiment of the present disclosure.

Referring to FIG. 10, which illustrates another embodiment of a thin film transistor substrate 200, a second interlayer insulating film 158 is disposed over the first interlayer insulating film 138, the source electrode 140, and drain electrode 142. Then, a contact hole 160 is formed in the second interlayer insulating film 158 by using photolithography and etching processes. The contact hole 160 extends through the second interlayer insulating film 158 to expose a portion of the drain electrode 142.

A transparent conductive thin film 162 is disposed on the second interlayer insulating film 158 and deposited in the contact hole 160 such that transparent conductive film 162 is in electrical communication with the drain electrode 142. The transparent conductive thin film 162 is patterned by using photolithography and etching process . The conductive thin film 162 is electrically connected to the corresponding thin film transistor 100, such that the thin film transistor substrate 200 of the present disclosure is formed.

Figure 11:
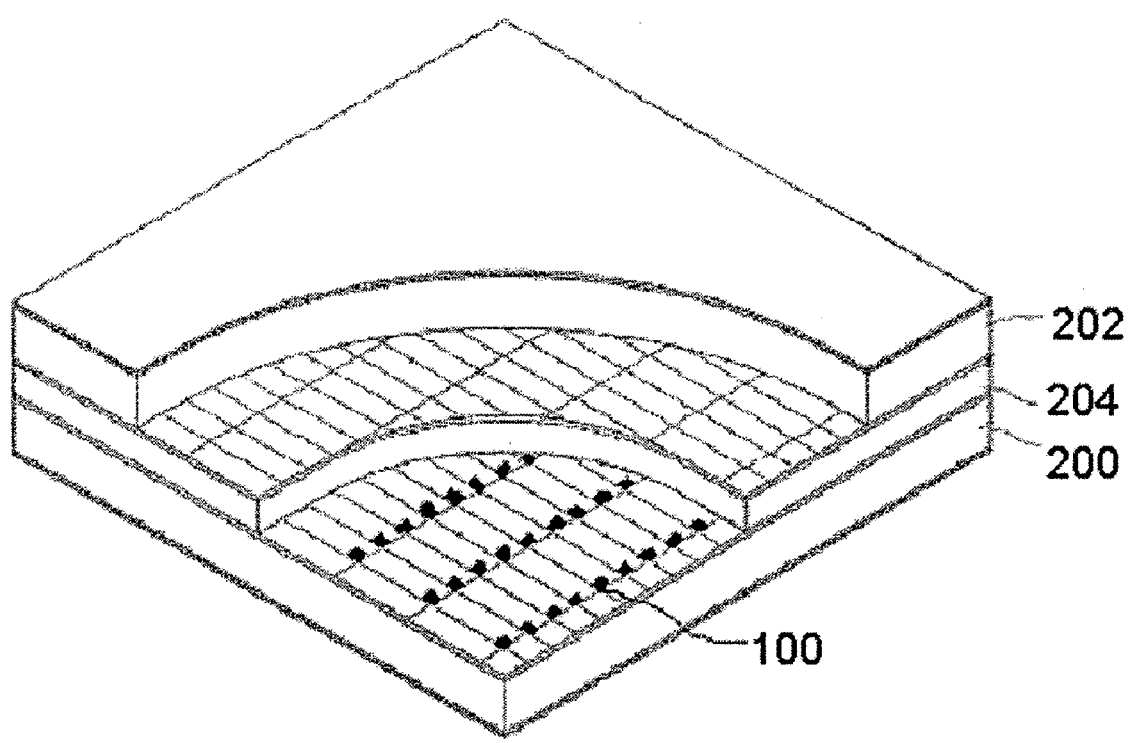
FIG. 11 is a cross-sectional view of a portion of a liquid crystal display according to an embodiment of the present disclosure.

The liquid crystal display (LCD) of the present disclosure is preferably a thin film transistor (TFT) LCD with a liquid crystal layer 204 sandwiched between a first substrate 202 and a second substrate 200. As shown in FIG. 11, the first substrate 202 of the present disclosure is referred to as a color filter (CF) substrate, while the second substrate 200 is referred to as above the thin film transistor (TFT) substrate. Usually, spacers are formed between the substrates for defining a cell gap between the substrates. It should be understood by those skilled in the art that the liquid crystal display can be provided comprising a thin film transistor 100 and a thin film transistor substrate as above.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A method of manufacturing a liquid crystal display, the method comprising:

providing a substrate;

disposing an initial channel layer on the substrate;

forming at least a portion of the initial channel layer into a shaped channel layer, and a thermal gradient inducer body proximal to the shaped channel layer;

wherein the shaped channel layer defining a nucleation region having a first transverse width and a crystal region having a second transverse width, the first transverse width is less than the second transverse width;

annealing the shaped channel layer and the thermal gradient inducer body.

2. The method of claim 1, the thermal gradient inducer body is formed from the initial channel layer by removing at least a portion of the initial channel layer.

3. The method of claim 1, wherein the thermal gradient inducer body and the shaped channel layer define a gap having a first length proximal to the nucleation region and a second length proximal to the crystal end, wherein the first length is greater than the second length.

4. The method of claim 1, wherein the thermal gradient inducer body causes the nucleation region of the shaped channel layer to dissipate heat faster than the crystal region.

* * * * *